United States Patent
Park et al.

(10) Patent No.: US 7,341,883 B2
(45) Date of Patent: Mar. 11, 2008

(54) SILICON GERMANIUM SEMICONDUCTIVE ALLOY AND METHOD OF FABRICATING SAME

(75) Inventors: Yeonjoon Park, Yorktown, VA (US); Sang H. Choi, Poquoson, VA (US); Glen C. King, Yorktown, VA (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 304 days.

(21) Appl. No.: 11/242,415

(22) Filed: Sep. 27, 2005

(65) Prior Publication Data

US 2007/0069195 A1    Mar. 29, 2007

(51) Int. Cl.
*H01L 21/00* (2006.01)
*H01L 29/04* (2006.01)
*C30B 23/00* (2006.01)

(52) U.S. Cl. .................. 438/46; 257/63; 257/E21.092; 117/101

(58) Field of Classification Search .................. 438/46, 438/93; 257/62, E21.092, 63; 117/101
See application file for complete search history.

(56) References Cited

U.S. PATENT DOCUMENTS

| 4,177,321 | A | 12/1979 | Nishizawa |
| 5,205,871 | A | 4/1993 | Godbey et al. |
| 5,667,586 | A | 9/1997 | Ek et al. |
| 5,759,898 | A | 6/1998 | Ek et al. |
| 5,951,757 | A | 9/1999 | Dubbelday et al. |
| 6,653,658 | B2 | 11/2003 | Burden |
| 6,784,074 | B2 | 8/2004 | Shchukin et al. |
| 6,787,793 | B2 | 9/2004 | Yoshida |

OTHER PUBLICATIONS

Koester. S.J., Hammond, R., Chu, J.O., Mooney, P.M., Ott, J.A., Webster, C.S., Lagnado, I., Houssaye, P.R., "Low Noise SiGe pMODFETs on Sapphire with 116 GHz fmax," Device Research Conference, 2000, p. 1-2 31-32, (Jun. 19, 2000).

*Primary Examiner*—Lex Malsawma
(74) *Attorney, Agent, or Firm*—Barry V. Gibbens; Linda B. Blackburn

(57) ABSTRACT

A silicon germanium (SiGe) semiconductive alloy is grown on a substrate of single crystalline $Al_2O_3$. A {111} crystal plane of a cubic diamond structure SiGe is grown on the substrate's {0001} C-plane such that a <110> orientation of the cubic diamond structure SiGe is aligned with a <1,0,-1,0> orientation of the {0001} C-plane. A lattice match between the substrate and the SiGe is achieved by using a SiGe composition that is 0.7223 atomic percent silicon and 0.2777 atomic percent germanium.

22 Claims, 2 Drawing Sheets

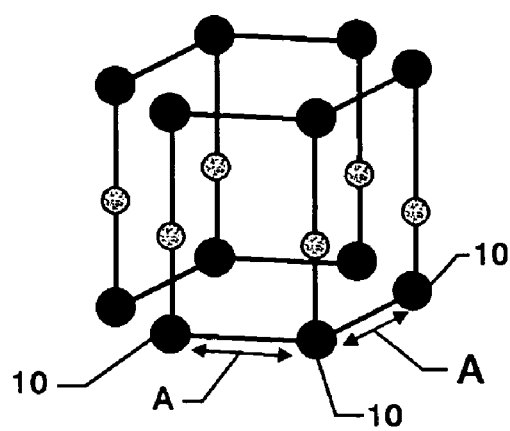
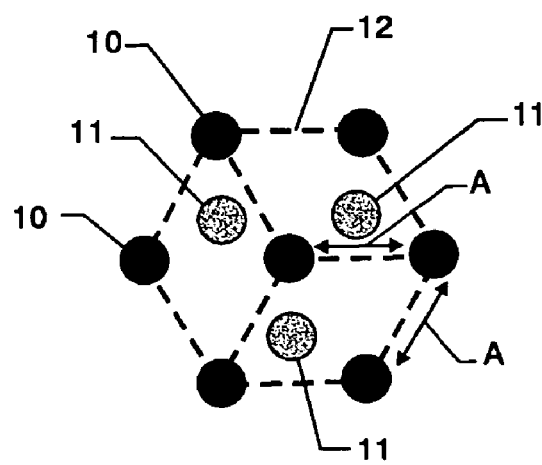
FIG. 1A  FIG. 1B
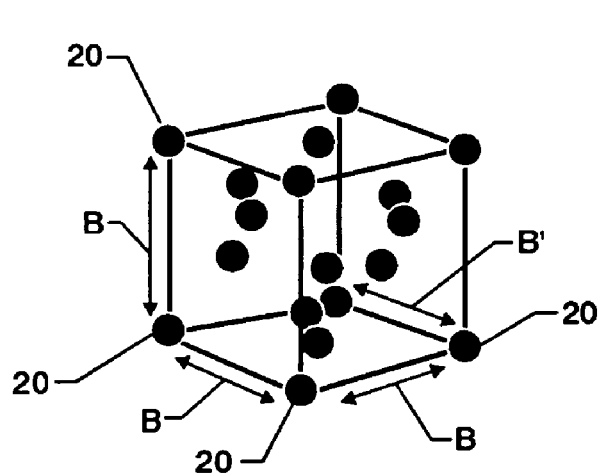
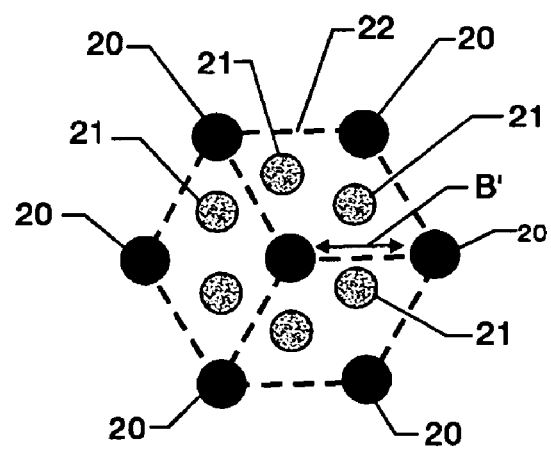
FIG. 2A  FIG. 2B

US 7,341,883 B2

SILICON GERMANIUM SEMICONDUCTIVE ALLOY AND METHOD OF FABRICATING SAME

ORIGIN OF THE INVENTION

The invention was made in part by an employee of the United States Government and may be manufactured and used by or for the Government of the United States of America for governmental purposes without the payment of any royalties thereon or therefor.

BACKGROUND OF THE INVENTION

1. Field of the Invention

This invention relates to semiconductive alloys made from silicon germanium. More specifically, the invention is a silicon germanium semiconductive alloy that can be fabricated in relatively thick layers without defects and dislocations.

2. Description of the Related Art

Silicon germanium (SiGe) is an important semiconductive alloy used in Field Effect Transistors (FETs), High Electron Mobility Transistors (HEMTs), Hetero Bi-polar Transistors (HBTs), Thermo-Electric (TE) devices, photovoltaic solar cells, and photon detectors. Typically, SiGe is grown on common silicon wafer substrates. However, the growth of thick (i.e., greater than tens of nanometers), high-quality (i.e., defect free) SiGe layers on a silicon substrate is difficult because SiGe has a larger lattice constant than silicon. This means that the SiGe layers close to the silicon substrate are strained while severe defects (e.g., micro twins, cracks, delaminations, etc.) develop in the layers of SiGe that exceed the critical thickness of tens of nanometers because of the lattice mismatch. Thus, at best, only strained SiGe layers with very thin thicknesses (i.e., less than tens of nanometers) are utilized for high-quality electronic device fabrication.

SUMMARY OF THE INVENTION

Accordingly, it is an object of the present invention to provide a silicon germanium (SiGe) semiconductive alloy and method of fabricating same.

Another object of the present invention is to provide a silicon germanium (SiGe) semiconductive alloy that is free of defects and dislocations.

Other objects and advantages of the present invention will become more obvious hereinafter in the specification and drawings.

In accordance with the present invention, a silicon germanium (SiGe) semiconductive alloy and method of fabricating same are provided. A substrate of single crystalline $Al_2O_3$ having a {0001} C-plane is exposed. A {111} crystal plane of a cubic diamond structure SiGe is grown on the {0001} C-plane such that a <110> orientation of the cubic diamond structure SiGe is aligned with a <1,0,−1,0> orientation of the {0001} C-plane. A lattice match between the single crystalline $Al_2O_3$ and the cubic diamond structure SiGe is achieved by using a SiGe composition that is 0.7223 atomic percent silicon and 0.2777 atomic percent germanium.

BRIEF DESCRIPTION OF THE DRAWINGS

FIG. 1A depicts the atomic structure of single crystalline aluminum oxide ($Al_2O_3$) sapphire;

FIG. 1B depicts an atomic, planar view of the {0001} C-plane of single crystalline $Al_2O_3$;

FIG. 2A depicts the cubic diamond atomic structure of silicon and germanium;

FIG. 2B depicts an atomic, planar view of the {111} crystal plane of the cubic diamond structure of FIG. 2A;

DETAILED DESCRIPTION OF THE INVENTION

Figure 3A:
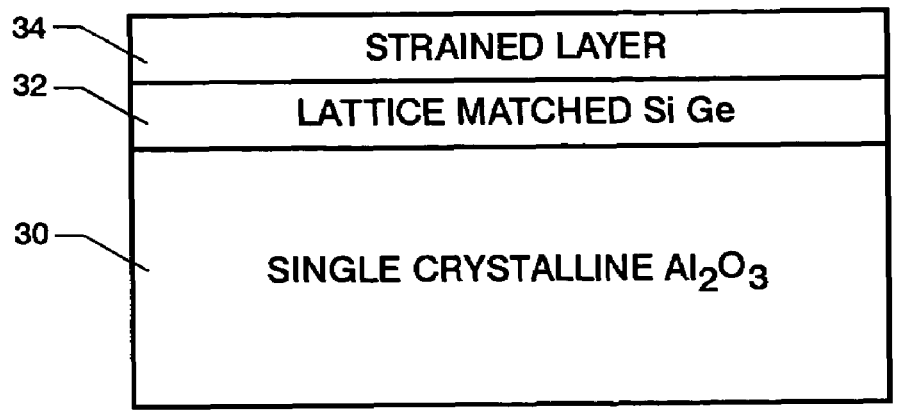
FIG. 3A is a schematic view of another embodiment of the present invention in which a strained layer is grown on top of the lattice matched SiGe of the present invention.

The present invention provides for fabrication of a high-quality (i.e., free of defects and dislocations) silicon germanium (SiGe) semiconductive alloy. The SiGe semiconductive alloy resulting from this fabrication approach will improve the speed of electric charge movement therethrough as there are no defects/dislocations to slow the charge movement. Accordingly, the present invention can be used to improve a variety of electronic devices using such SiGe to include, but not limited to, Field Effect Transistor (FETs), High Electron Mobility Transistors (HEMTs), Hetero Bi-polar Transistors (HBTs), Thermo-Electric (TE) devices, photovoltaic solar cells, and photon detectors.

The SiGe semiconductive alloy of the present invention includes growing a cubic diamond structure SiGe on a trigonal crystal structure of single crystalline aluminum oxide ($Al_2O_3$) sapphire referred to hereinafter as "single crystalline $Al_2O_3$". The goal of zero defect/dislocations in a SiGe semiconductive alloy is achieved by arranging for a lattice match between the cubic diamond structure SiGe and the single crystalline $Al_2O_3$. In order to explain the lattice matching provided by the present invention, reference will now be made to FIGS. 1A-1B and FIGS. 2A-2B. In the ensuing description, the well-known Miller indices notation of lattice planes will be used. That is, crystal planes are designated by numbers within "( )", groups of similar planes are designated by numbers within "{ }" direction or length is designated by numbers within "[ ]", and groups of similar directions are designated by numbers within "< >".

In FIG. 1A, the atomic structure of single crystalline $Al_2O_3$ is illustrated with the basal plane's lattice constant (i.e., atomic distance) denoted by the letter "A". For single crystalline $Al_2O_3$, A is equal to 4.7580 angstroms. A hexagonal structure of the {0001} C-plane (i.e., one of the group of eight similar planes) of single crystalline $Al_2O_3$ is illustrated in FIG. 1B where the dark shaded circles represent atoms 10 in the {0001} C-plane and the light shaded circles represent atoms 11 on a layer of the structure beneath the {0001} C-plane. The hexagonal relationship with atoms 10 at the vertices thereof is referenced by numeral 12 and defines the <1,0,−1,0> orientation (i.e., the group of eight directions corresponding to the eight similar planes defined by the {0001} C-plane) of the {0001} C-plane. As is known in the art and for purposes of the present invention, the term "{0001} C-plane" refers to single crystalline $Al_2O_3$ that has been perfectly cut along the {0001} C-plane as well as slightly miscut single crystalline $Al_2O_3$ where "slightly miscut" refers to cut angles of approximately ±10° or less.

Methods of cutting single crystalline $Al_2O_3$ to expose the perfect or miscut {0001} C-plane thereof are well known in the art.

In FIG. 2A, the cubic diamond atomic structure of silicon and germanium is illustrated with a side dimension lattice constant (i.e., atomic distance between atoms 20) of "B" and the shortest atomic distance (between atoms) lattice constant being B' in the {111} crystal plane of the cubic diamond structure. FIG. 2B depicts a planar view of the {111} crystal plane of the cubic diamond structure where the dark shaded circles represent atoms 20 in the {111} crystal plane and the light shaded circles represent atoms 21 on a layer of the structure beneath the {111} crystal plane. The hexagonal relationship with atoms 20 at the vertices thereof is referenced by numeral 22 and defines the <110> orientation of the {111} crystal plane. The relationship between B and B' in the cubic diamond structure is B'=B(sqrt(3)/2). For a SiGe alloy having a cubic diamond structure, the value for B and, therefore B') is dependent on the composition of the alloy. That is, for the general $Si_{1-x}Ge_x$ alloy with germanium composition x in atomic percent, the lattice constant $B_{SiGe}$ is defined by $$xB_{Ge}+(1-x)B_{Si}$$

where $B_{Ge}$ is the side dimension lattice constant of germanium (i.e., 5.65791 angstroms), and $B_{Si}$ is the side dimension lattice constant of silicon (i.e., 5.43107 angstroms). Applying the above relationships, $B_{SiGe}$ is equal to approximately 5.49406 angstroms and the lattice constant $B'_{SiGe}$ in the {111} crystal plane of the cubic diamond structure SiGe is equal to approximately 4.5780 angstroms when x=0.2777.

The present invention achieves defect and dislocation-free SiGe growth by a lattice matching technique that defines the (i) plane and orientation relationships between cubic diamond SiGe and the $Al_2O_3$ substrate, and (ii) the composition of the cubic diamond SiGe. For lattice matched SiGe growth on single crystalline $Al_2O_3$, the {111} crystal plane of cubic diamond SiGe is grown on the {0001} C-plane of single crystalline $Al_2O_3$. Growth is controlled such that the <110> orientation of cubic diamond SiGe is aligned (i.e., parallel to) with the <1,0,−1,0> orientation of the {0001} C-plane.

The above described plane/orientation alignment achieves an exact lattice match when the cubic diamond SiGe, having a general composition defined by $Si_{1-x}Ge_x$, has a germanium composition of 0.2777 atomic percent and a silicon composition of 0.7223 atomic percent. At this composition, the lattice constant $B'_{SiGe}$ is given by $$sqrt(3)/2(xB_{Ge}+(1-x)B_{Si})$$

which equates to 4.7580 angstroms for x=0.2777, thereby exactly matching the lattice constant A of single crystalline $Al_2O_3$. Therefore, by what amounts to a rhombohedral transformation of lattice parameters, the present invention provides for lattice matching between cubic diamond SiGe and the single crystalline $Al_2O_3$ during the growth process thereby eliminating defects and dislocations caused by lattice mismatches. The lattice matching provided by the present invention will allow a thick, high-quality semiconductive SiGe alloy to be grown for use in a wide variety of electronic devices. Slight deviations from the germanium composition of 0.2777 atomic percent may be acceptable for some applications even though an exact matching of the lattice constant is not achieved.

Implementation of the present invention can be achieved in a variety of ways. For example, the single crystalline $Al_2O_3$ can be obtained commercially or manufactured. The single crystalline $Al_2O_3$ substrate can be cleaned with degreasing and/or etching process before growth of the SiGe semiconductive alloy thereon. Lattice matched SiGe layer(s) can be grown with various standard growth methods, including but not limited to, Molecular Beam Epitaxy (MBE), Metal-Organic Chemical Vapor Deposition (MOCVD), Metal-Organic Chemical Vapor Phase Epitaxy (MOVPE), Hydride Vapor Phase Deposition (HVPE), Liquid Phase Epitaxy (LPE), Physical Vapor Deposition (PVD), Pulsed Laser Deposition (PLD), and sputtering methods. Germanium contents can be measured and calibrated with standard techniques, including but not limited to, Secondary Ion Mass Spectroscopy (SIMS), X-ray Diffraction (XRD), and ellipsometry.

To fabricate the final device structures, standard microfabrication technologies can be used, including but not limited to, lithography, etching, metalization, dopant diffusion/implantation and oxidation. The resulting cubic diamond SiGe on single crystalline $Al_2O_3$ can be used "as is" or can be removed from the substrate after growth to a desired thickness. Such methods of removal are well known in the art and could include laser cutting, hydrogen cracking, etc., the choice of which is not a limitation of the present invention.

The SiGe semiconductive alloy grown on single crystalline $Al_2O_3$ in the manner described above can also serve as the base for growth of additional materials/layers to adjust the charge mobility characteristics of the resulting semiconductive alloy. Several non-limiting examples of such semiconductive alloy structures are illustrated in FIGS. 3A-3C.

In FIG. 3A, the above-described single crystalline $Al_2O_3$ is referenced by numeral 30 and the above-described lattice matched SiGe is referenced by numeral 32. A strained layer 34 can be grown on top of lattice matched SiGe 32. The composition of layer 34 can be pure silicon, pure germanium, or a silicon germanium composition of the general form $Si_{1-y}Ge_y$ where y is the atomic percent of germanium that satisfies the relationship 0.0<y<1.0. The resulting alloy structure can be used in a variety of electronic devices. For example, artificially strained layers under compressive stress or tensile stress can change electron or hole mobility and optical properties such as refractive index, band-gap energy, absorption energy, emission energy, optical axis, etc.

Figure 3B:
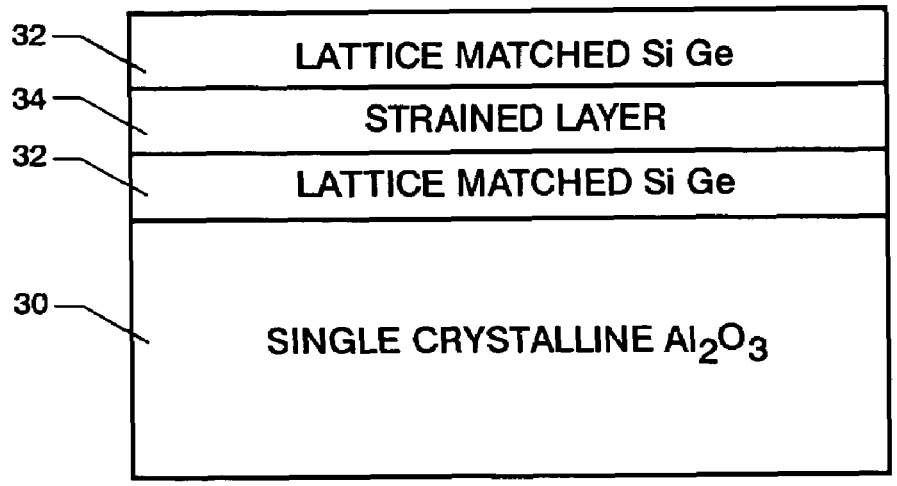
FIG. 3B is a schematic view of another embodiment of the present invention in which a single layer is inserted between layers of lattice matched SiGe of the present invention.

In FIG. 3B, a single embedded strained layer can be (i) grown between layers of lattice matched SiGe 32 by means of sequential epitaxial growth, or (ii) inserted after growth by means of ion implantation as would be well understood in the art. The composition of layer 36 can be pure silicon, pure germanium, or a silicon germanium composition of the general form $Si_{1-y}Ge_y$ where y is the atomic percent of germanium that satisfies the relationship 0.0<y<1.0. For example, if layer 36 is strained pure silicon, it will provide high carrier mobility for electron channels in High Electron Mobility Transistors (HEMTs) or Hetero Bi-polar Transistors (HBTs).

Figure 3C:
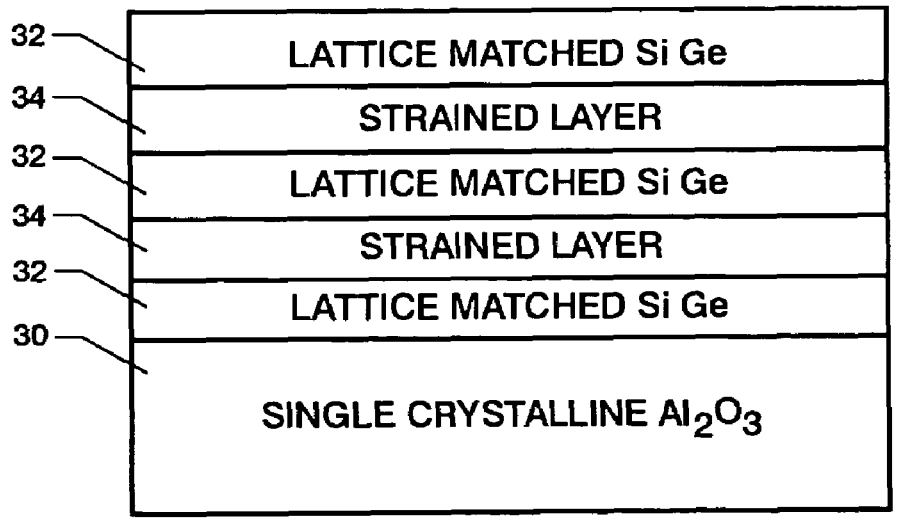
FIG. 3C is a schematic view of another embodiment of the present invention in which a super lattice is grown on lattice matched SiGe of the present invention.

In FIG. 3C, a super lattice (i.e., repetition of layers) is grown on top of lattice matched SiGe 32 grown on substrate 30. For example, the super lattice could consist of multiple repeats of strained layer 34 and lattice matched SiGe 32. Super lattice constructions are frequently used to improve the quality of epitaxial films by, for example, releasing lattice strain, reducing abrupt changes in conduction band offset or valence band offset, etc.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method of fabricating a silicon germanium (SiGe) semiconductive alloy, comprising the steps of:
    providing a substrate of single crystalline $Al_2O_3$ having a {0001} C-plane that is exposed; and
    growing a {111} crystal plane of a cubic diamond structure SiGe on said {0001} C-plane such that a <110> orientation of said cubic diamond structure SiGe is aligned with a <1,0,−1,0> orientation of said {0001} C-plane, said cubic diamond structure SiGe having 0.7223 atomic percent silicon and 0.2777 atomic percent germanium.

2. A method according to claim 1 further comprising the step of removing said cubic diamond structure SiGe so-grown from said substrate.

3. A method according to claim 1 further comprising the step of growing pure silicon on said cubic diamond structure SiGe so-grown on said {0001} C-plane.

4. A method according to claim 1 further comprising the step of growing pure germanium on said cubic diamond structure SiGe so-grown on said {0001} C-plane.

5. A method according to claim 1 further comprising the step of growing $Si_{1-y}Ge_y$ on said cubic diamond structure SiGe so-grown on said {0001} C-plane, wherein y defines an atomic percent of germanium defined by $0.0<y<1.0$.

6. A method according to claim 1 wherein said step of growing produces layers of said cubic diamond structure SiGe, and wherein said method further comprises the step of interposing at least one strained layer of $Si_{1-y}Ge_y$ between said layers wherein y defines an atomic percent of germanium defined by $0.0 \leq y \leq 1.0$.

7. A method of fabricating a silicon germanium (SiGe) semiconductive alloy, comprising the steps of:
    providing a substrate of single crystalline $Al_2O_3$ having a {0001} C-plane that is exposed; and
    growing a {111} crystal plane of a cubic diamond structure defined by a general form $Si_{1-x}Ge_x$ on said {0001} C-plane such that a <110> orientation of said cubic diamond structure is aligned with a <1,0,−1,0> orientation of said {0001} C-plane, wherein x defines an atomic percent of germanium approximately equal to 0.2777.

8. A method according to claim 7 further comprising the step of removing said cubic diamond structure so-grown from said substrate.

9. A method according to claim 7 further comprising the step of growing pure silicon on said cubic diamond structure so-grown on said {0001} C-plane.

10. A method according to claim 7 further comprising the step of growing pure germanium on said cubic diamond structure so-grown on said {0001} C-plane.

11. A method according to claim 7 further comprising the step of growing $Si_{1-y}Ge_y$ on said cubic diamond structure so-grown on said {0001} C-plane, wherein y defines another atomic percent of germanium defined by $0.0<y<1.0$.

12. A method according to claim 7 wherein said step of growing produces layers of said cubic diamond structure, and wherein said method further comprises the step of interposing at least one strained layer of $Si_{1-y}Ge_y$ between said layers wherein y defines another atomic percent of germanium defined by $0.0 \leq y \leq 1.0$.

13. A silicon germanium (SiGe) semiconductive alloy grown on a {0001} C-plane of single crystalline $Al_2O_3$, comprising a cubic diamond structure SiGe having 0.7223 atomic percent silicon and 0.2777 atomic percent germanium, said cubic diamond structure SiGe having a {111} crystal plane grown on the {0001} C-plane such that a <110> orientation of said cubic diamond structure SiGe is aligned with a <1,0,−1,0> orientation of the {0001} C-plane.

14. A silicon germanium (SiGe) semiconductive alloy as in claim 13 further comprising pure silicon grown on said cubic diamond structure SiGe so-grown on said {0001} C-plane.

15. A silicon germanium (SiGe) semiconductive alloy as in claim 13 further comprising pure germanium grown on said cubic diamond structure SiGe so-grown on said {0001} C-plane.

16. A silicon germanium (SiGe) semiconductive alloy as in claim 13 further comprising $Si_{1-y}Ge_y$ grown on said cubic diamond structure SiGe so-grown on said {0001} C-plane, wherein y defines an atomic percent of germanium defined by $0.0<y<1.0$.

17. A silicon germanium (SiGe) semiconductive alloy as in claim 13 wherein said cubic diamond structure SiGe is grown in layers thereof, and further comprising at least one strained layer of $Si_{1-y}Ge_y$ interposed between said layers wherein y defines an atomic percent of germanium defined by $0.0 \leq y \leq 1.0$.

18. A silicon germanium (SiGe) semiconductive alloy grown on a {0001} C-plane of single crystalline $Al_2O_3$, comprising a cubic diamond structure defined by a general form $Si_{1-x}Ge_x$ and having a {111} crystal plane grown on the {0001} C-plane such that a <110> orientation of said cubic diamond structure is aligned with a <1,0,−1,0> orientation of the {0001} C-plane, wherein x defines an atomic percent of germanium approximately equal to 0.2777.

19. A silicon germanium (SiGe) semiconductive alloy as in claim 18 further comprising pure silicon grown on said cubic diamond structure so-grown on said {0001} C-plane.

20. A silicon germanium (SiGe) semiconductive alloy as in claim 18 further comprising pure germanium grown on said cubic diamond structure so-grown on said {0001} C-plane.

21. A silicon germanium (SiGe) semiconductive alloy as in claim 18 further comprising $Si_{1-y}Ge_y$ grown on said cubic diamond structure so-grown on said {0001} C-plane, wherein y defines an atomic percent of germanium defined by $0.0<y<1.0$.

22. A silicon germanium (SiGe) semiconductive alloy as in claim 18 wherein said cubic diamond structure is grown in layers thereof, and further comprising at least one strained layer of $Si_{1-y}Ge_y$ interposed between said layers wherein y defines another atomic percent of germanium defined by $0.0 \leq y \leq 1.0$.

* * * * *